United States Patent
Kobayashi

(10) Patent No.: US 7,812,684 B2
(45) Date of Patent: Oct. 12, 2010

(54) COMMUNICATION APPARATUS

(75) Inventor: Hiroyuki Kobayashi, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 111 days.

(21) Appl. No.: 12/336,923

(22) Filed: Dec. 17, 2008

(65) Prior Publication Data
US 2009/0160572 A1 Jun. 25, 2009

(30) Foreign Application Priority Data
Dec. 25, 2007 (JP) ............... 2007-331964

(51) Int. Cl.
*H03C 3/00* (2006.01)
(52) U.S. Cl. ............ 332/145; 332/146; 332/152; 341/143; 455/102; 455/110
(58) Field of Classification Search ........... 322/145, 322/146, 152; 341/143; 455/42, 102, 110
See application file for complete search history.

(56) References Cited

U.S. PATENT DOCUMENTS

| | | | |
|---|---|---|---|
| 7,280,056 B2 * | 10/2007 | Puma | 341/76 |
| 2005/0202790 A1 * | 9/2005 | Matsuura et al. | 455/118 |
| 2008/0042886 A1 | 2/2008 | Li Puma | |

OTHER PUBLICATIONS

Robert Bogdan Staszewski, et al., "All-Digital PLL and Transmitter for Mobile Phones", IEEE Journal of Solid-State Circuits, vol. 40, No. 12, Dec. 2005, 7 pages.

* cited by examiner

*Primary Examiner*—Robert Pascal
*Assistant Examiner*—James E Goodley
(74) *Attorney, Agent, or Firm*—Oblon, Spivak, McClelland, Maier & Neustadt, L.L.P.

(57) ABSTRACT

A communication apparatus has a local oscillator which performs phase modulation based on a phase component of a baseband signal and outputs a phase modulated signal, a controlling circuit which is supplied with an integer portion included in an amplitude component of the baseband signal and generates and outputs a controlling signal based on a size of the integer portion, a subtractor which is supplied with the integer portion and the controlling signal, subtracts a value of the controlling signal from the integer portion, and outputs a result, a MASH (Multi-stAge-noise-Shaping) circuit which is a second-order delta-sigma modulation means supplied with a fractional portion of the amplitude component, an order of the MASH circuit being switchable between a first order and a second order based on the controlling signal, and an amplifier which sets a voltage value based on an output of the MASH circuit and an output of the subtractor, multiplies the voltage value and the phase modulated signal, and outputs a result.

13 Claims, 3 Drawing Sheets

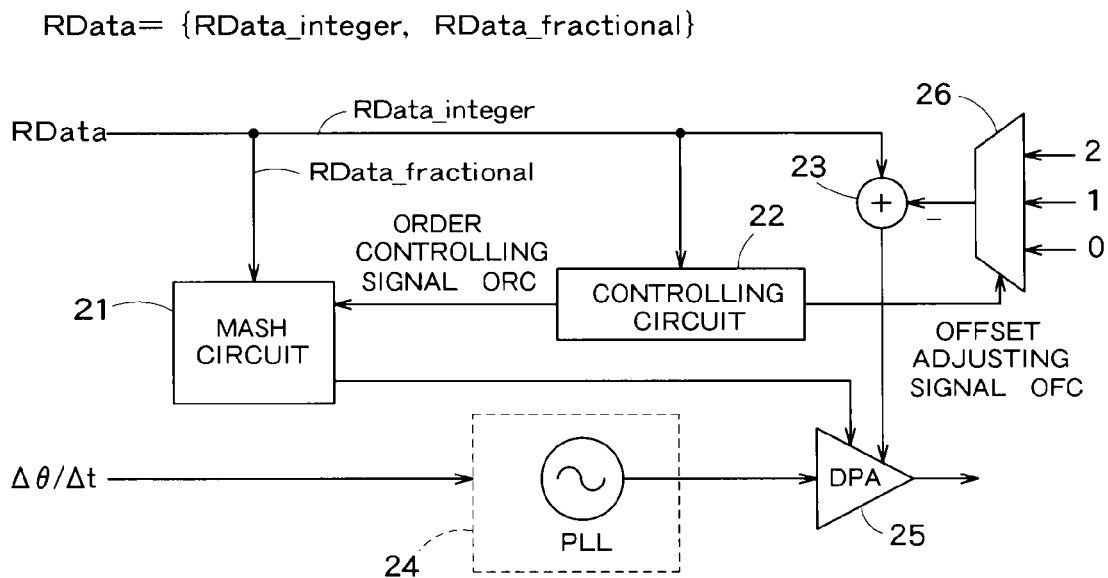
F I G. 3
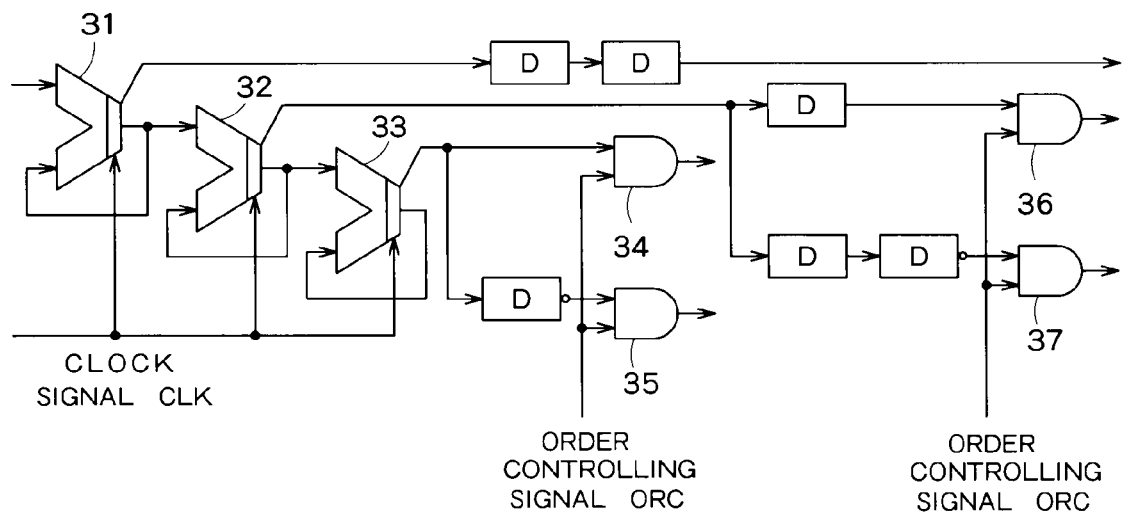
F I G. 4

COMMUNICATION APPARATUS

CROSS REFERENCE TO RELATED APPLICATIONS

This application is based upon and claims benefit of priority from the Japanese Patent Application No. 2007-331964, filed on Dec. 25, 2007, the entire contents of which are incorporated herein by reference.

BACKGROUND OF THE INVENTION

The present invention relates to a communication apparatus.

One modulation technique currently in general use is I/Q modulation. With this technique, a modulation signal is treated as a complex amplitude with a real number portion corresponding to an in-phase component and an imaginary number portion corresponding to a quadrature component. In other words, the points in an X-Y coordinate system are used as data, and the data is expressed as an X-Y signal which is multiplied by the carrier frequency.

Recently, another method called polar modulation has come into use. According to polar modulation, modulation is performed by expressing the data as an amplitude and an angle. A frequency synthesizer then performs modulation in the angular direction using frequency modulation. Meanwhile, the modulation in the amplitude direction is used to control a gain of a power amplifier (hereinafter "PA").

There are two well-known methods of amplitude modulation in polar modulation. In one method, source amplitude modulation data is converted to an analog controlling signal via a digital-to-analog converter (hereinafter referred to as a "DAC") and a low-pass filter (hereinafter referred to as an "LPF"), and the analog controlling signal is fed to the PA to change the gain. This method has an advantage in that the effects of quantization noise included in the source data can be eliminated, but requires that the DAC and the LPF are provided. Moreover, the delays generated by the DAC and the LPF have to be corrected. It is further required that the PA has a linear gain with respect to the supplied amplitude data (analog controlling signal).

In the other method, the amplitude modulation data is not passed through the DAC and the LPF, and is instead provided in unmodified form as a digital value to a digitally controlled power amplifier (hereinafter DPA) for amplitude control. However, the dynamic range of the DPA is smaller than the dynamic range of the amplitude modulation data. This method has a further problem in that there is no function for removing the quantization noise, and so all the noise appears in the output.

To solve such problems a configuration has been proposed (see, for instance, Robert Bogdan Staszewski et. al, "All-Digital PLL and Transmitter for Mobile Phones" the Journal of Solid-State Circuits, December 2005, vol. 40, No. 12, 2469) in which a delta-sigma ($\Delta\Sigma$) modulator or the like is used to perform oversampling at a frequency higher than a clock used to produce the amplitude modulation data, expand the dynamic range, spread the quantization noise to a high-frequency side, and improve the resolution of the original signal.

The $\Delta\Sigma$ modulator has a construction which has an offset. In modulation schemes in which the data points are located on the circumference of a circle such as PSK (Phase Shift Keying), small amplitude information does not have a large meaning, and so the offset of the $\Delta\Sigma$ modulator is not a problem.

However, in modulation schemes which include data points when the amplitude such as QAM (Quadrature AM) is small, the problem arises of not being able to correctly express the data due to the offset.

SUMMARY OF THE INVENTION

According to one aspect of the present invention, there is provided a communication apparatus comprising:
a local oscillator which performs phase modulation based on a phase component of a baseband signal and outputs a phase modulated signal;
a controlling circuit which is supplied with an integer portion included in an amplitude component of the baseband signal and generates and outputs a controlling signal based on a size of the integer portion;
a subtractor which is supplied with the integer portion and the controlling signal, subtracts a value of the controlling signal from the integer portion, and outputs a result;
a MASH (Multi-stAge-noise-Shaping) circuit which is a second-order delta-sigma modulation means supplied with a fractional portion of the amplitude component, an order of the MASH circuit being switchable between a first order and a second order based on the controlling signal; and
an amplifier which sets a voltage value based on an output of the MASH circuit and an output of the subtractor, multiplies the voltage value and the phase modulated signal, and outputs a result.

According to one aspect of the present invention, there is provided a communication apparatus comprising:
a local oscillator which performs phase modulation based on a phase component of a baseband signal and outputs a phase modulated signal;
a controlling circuit which is supplied with an integer portion included in an amplitude component of the baseband signal, and generates and outputs an order controlling signal and an offset adjusting signal based on a size of the integer portion;
a multiplexer which selects and outputs an output value of 0, 1 or 2 based on the offset adjusting signal;
a subtractor which is supplied with the integer portion and the output value of the multiplexer, subtracts the output value of the multiplexer from the integer portion, and outputs a subtraction result;
a MASH circuit which is a third-order delta-sigma modulation means supplied with a fractional portion of the amplitude component, an order of the MASH circuit being switchable among a first order, a second order and a third order based on the order controlling signal; and
an amplifier which sets a voltage value based on an output of the MASH circuit and an output of the subtractor, multiplies the voltage value with the phase modulated signal, and outputs a result.

According to one aspect of the present invention, there is provided a communication apparatus comprising:
a local oscillator which performs phase modulation based on a phase component of a baseband signal and outputs a phase modulated signal;
a controlling circuit which is supplied with an integer portion included in an amplitude component of the baseband signal, and generates and outputs an order controlling signal and an offset adjusting signal based on a size of the integer portion;
an offset adjusting unit which outputs a value from 0 to N−1 (where N is an integer no less than 4) based on the offset adjusting signal;

a subtractor which is supplied with the integer portion and the value outputted by the offset adjusting unit, subtracts the value outputted by the offset adjusting unit from the integer portion, and outputs a result;

a MASH circuit which is a delta-sigma modulation means of order N supplied with a fractional portion of the amplitude component, an order being switchable to any order from N to 1 based on the order controlling signal; and an amplifier which sets a voltage value based on an output of the MASH circuit and an output of the subtractor, multiplies the voltage value and the phase modulated signal, and outputs a result.

BRIEF DESCRIPTION OF THE DRAWINGS

FIG. 3 is a schematic diagram of the communication apparatus according to a second embodiment of the invention;

FIG. 4 is a schematic diagram of a MASH circuit in the second embodiment; and

DESCRIPTION OF THE EMBODIMENTS

The following describes a communication apparatus according to embodiments of the invention with reference to the drawings.

First Embodiment

Figure 1:
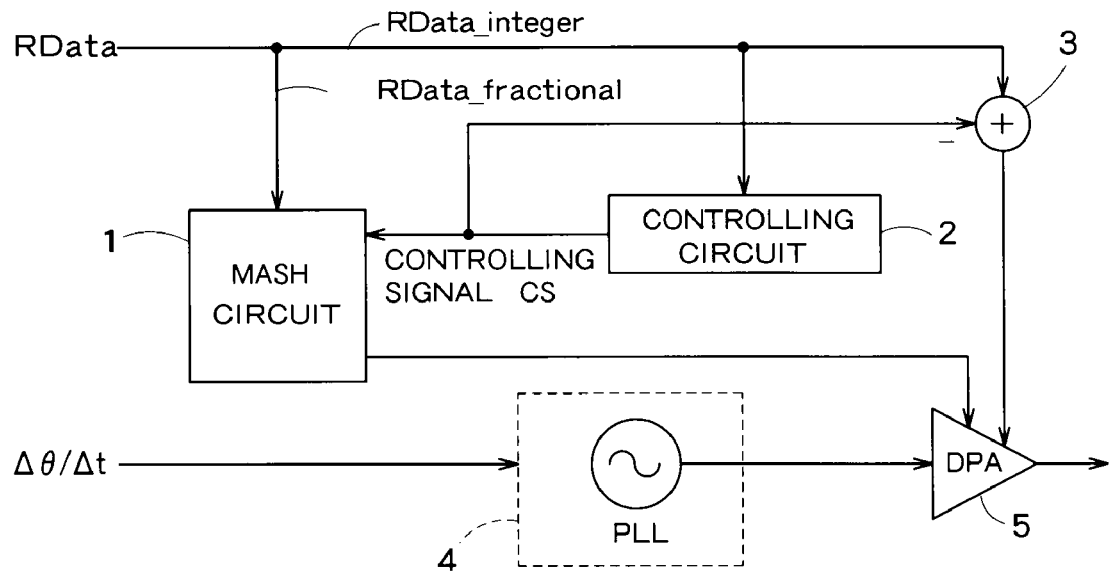
FIG. 1 is a schematic diagram of a communication apparatus according to a first embodiment of the invention.

FIG. 1 shows a schematic configuration of a communication apparatus according to a first embodiment of the invention. The communication apparatus according to the present embodiment is a polar modulation communication apparatus which includes a MASH (Multi-stAge-noise-Shaping) circuit 1, a controlling circuit 2, a subtractor 3, a local oscillator 4 and a digitally controlled power amplifier (hereinafter DPA) 5. Polar modulation is realized by expressing the data (baseband signal) using amplitude and a phase and realizing a combination of amplitude modulation and phase modulation.

The local oscillator 4 is supplied with the change in phase θ with respect to time (differential value Δθ/Δt) which is a phase component of the baseband signal. A PLL (Phase Locked Loop) circuit performs phase modulation as frequency modulation, and outputs the modulation result (phase modulated signal) to the DPA 5.

A discrete amplitude controlling signal (RData) which is an amplitude component of the baseband signal is made up of an integer portion (RData_integer) and a fractional portion (RData_fractional). The integer portion is supplied to the controlling circuit 2 and the subtractor 3 and the fractional portion is supplied to the MASH circuit 1. For instance, in a 14-bit amplitude controlling signal, the six upper-order bits make up the integer portion and the eight lower-order bits make up the fractional portion.

The controlling circuit 2 outputs to the subtractor 3 and the MASH circuit 1 a controlling signal CS with a value of "1" when the size of the integer portion (input amplitude) is greater than "1" and with a value of "0" when the integer portion is "1" or less.

The subtractor 3 subtracts the value of the controlling signal CS from the integer portion (RData_integer), and outputs the result to the DPA 5.

Figure 2:
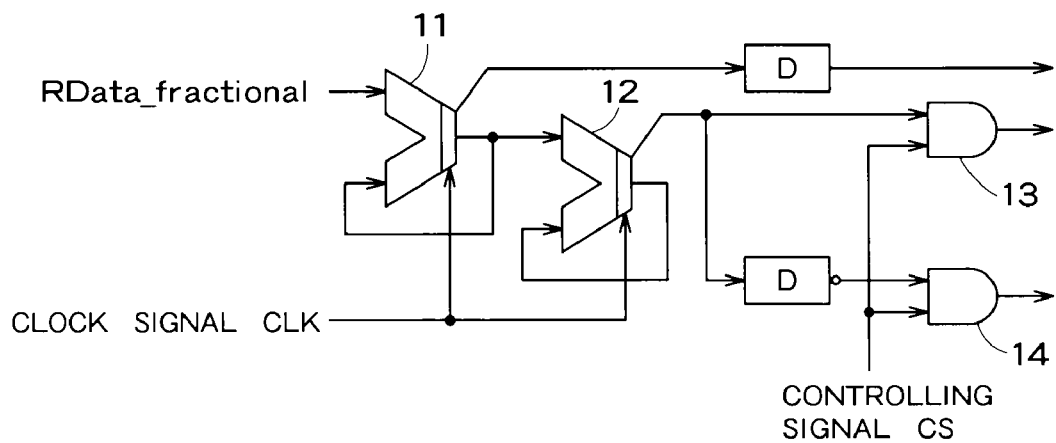
FIG. 2 is a schematic diagram of a MASH circuit in the first embodiment.

A schematic configuration of the MASH circuit 1 is shown in FIG. 2. The MASH circuit 1 has two first-order ΔΣ modulators connected in two stages to form a second-order ΔΣ modulation means. Hence, the offset amount is "1". Adders 11 and 12 are supplied with a clock signal CLK of a frequency higher than the clock used to generate the amplitude controlling signal (RData), and oversampling is performed. The MASH circuit 1 expands the dynamic range and spreads the quantization noise towards the high-frequency side.

AND gates 13 and 14 each receive input of the controlling signal CS outputted from the controlling circuit 2. When the size (input amplitude) of the integer portion (RData_integer) is "1" or less, the value of the controlling signal CS is "0". Hence, the output of the second-order side of the MASH circuit 1 is fixed at "0" and the order of the MASH circuit 1 is switched to "1". When the order is "1", no offset is generated in the MASH circuit 1.

The DPA 5 sets a source voltage value based on an output of the subtractor 3 and an output of the MASH circuit 1. In other words, the source voltage value is modulated. The source voltage value is multiplied with the phase modulated signal outputted from the local oscillator 4 and the result is outputted.

With this configuration, when the integer portion (RData_integer) of the amplitude controlling signal is greater than "1", the MASH circuit 1 operates as a second order MASH, and an offset (=1) is generated. An amount corresponding to the amount of offset is subtracted from the integer portion (RData_integer) by the subtractor 3. As a result, the offset does not appear in the output of DPA 5.

Further, when the integer portion of the amplitude controlling signal is "1" or less, the MASH circuit 1 is switched to being first order so that no offset is generated. At this point, since the value of the controlling signal CS becomes "0", the value of the integer portion remains unchanged. As a result, the DPA 5 can obtain a correct output even when the input amplitude is "1" or less.

In the present embodiment, when the input amplitude is greater than an amount of offset of the MASH circuit, the offset amount is subtracted from the integer portion. When the input amplitude is smaller than the offset amount of the MASH circuit, the MASH circuit is set to be first order so that offset is not generated. With this arrangement, offset-free correct output can be obtained for the input.

Thus, the communication apparatus according to the present embodiment retains the advantages of high-order oversampling while being capable of digitally modulating small amplitudes, and can therefore be applied to modulation schemes in which data points are included even when the input amplitude is small.

Second Embodiment

A communication apparatus according to a second embodiment of the invention is shown in FIG. 3. The communication apparatus is a polar modulation communication apparatus including a MASH circuit 21, a controlling circuit 22, a subtractor 23, a local oscillator 24, a DPA 25 and a multiplexer 26.

Since the functions of the local oscillator 24 and the DPA 25 are the same as the functions of the local oscillator 4 and the DPA 5 in the first embodiment above, further description of these components is omitted.

The multiplexer 26 is supplied with three values of "0", "1", and "2". One of the values is then selected based on an offset adjusting signal OFC outputted from the controlling circuit 22, and outputted to the subtractor 23.

The subtractor 23 subtracts the output value of the multiplexer 26 from the integer portion (RData_integer) of the amplitude controlling signal (RData), and outputs the result to the DPA 25.

The controlling circuit 22 outputs an order controlling signal ORC and an offset adjusting signal OFC based on a size of the integer portion (RData_integer) of the amplitude controlling signal (RData). Specifically, when the size of the integer portion is greater than "2", an order controlling signal ORC with a two-bit value of "11" is outputted. Further, when the size of the integer portion is greater than "1" and no more than "2", a two-bit value of "01" is outputted, and when the size of the integer portion is "1" or less, a two-bit value of "00" is outputted.

Moreover, the controlling circuit 22 outputs offset adjusting signals OFC such that "2" is selected and outputted from the multiplexer 26 when the integer portion is greater than "2", "1" is selected and outputted from the multiplexer 26 when the integer portion is greater than "1" and no more than "2", and "0" is selected and outputted from the multiplexer 26 when the integer portion is "1" or less.

In the above-described first embodiment, the MASH circuit 1 acts as a second-order $\Delta\Sigma$ modulation means. In the present embodiment, however, the MASH circuit 21 acts as a third-order $\Delta\Sigma$ modulation means as a result of three first-order $\Delta\Sigma$ modulators in three stages, as shown in FIG. 4. When the MASH circuit has an order of "3", the generated offset amount is "2".

Adders 31, 32 and 33 are supplied with a clock signal CLK of a frequency higher than the clock which generates the amplitude controlling signal (RData), and oversampling is performed.

The AND gates 34 and 35 each receive input of the higher-order bit of the 2-bit order controlling signal ORC. Further the AND gates 36 and 37 each receive input of the lower-order bit of the order controlling signal ORC.

Hence, when the size (input amplitude) of the integer portion (RData_integer) is greater than "1" and no more than "2", the output of the third-order side of the MASH circuit 21 is fixed at "0", thereby switching the order of the MASH circuit 21 to "2". Further, when the size (input amplitude) of the integer portion is "1" or less, the outputs of the third and second-order sides of the MASH circuit 21 are fixed to "0", thereby switching the order of the MASH circuit 21 to "1".

Thus, with this configuration, when the integer portion of the amplitude controlling signal is greater than "2", the MASH circuit 21 operates as a third-order MASH circuit, and an offset (=2) is generated. A value which matches the offset amount is selected and outputted by the multiplexer 26, and subtracted from the integer portion by the subtractor 23. As a result, the offset does not appear in the output of the DPA 25.

Further, when the size of the integer portion of the amplitude controlling signal is greater than "1" but no more than "2", the MASH circuit 21 operates as a second-order MASH, and an offset (=1) is generated. A value which matches the offset amount is selected and outputted by the multiplexer 26, and subtracted from the integer portion by the subtractor 23. As a result, the offset does not appear in the output of the DPA 25.

Further, when the integer portion of the amplitude controlling signal is "1" or less, the order of the MASH circuit 21 is switched to being first order so that no offset is generated. Since the multiplexer 26 selects and outputs "0", the value of the integer portion remains unchanged. As a result, the DPA 5 can obtain a correct output even when the input amplitude is "1" or less.

In the present embodiment, the order of the MASH circuit is switched according to the input amplitude and a value equal to the generated offset amount is subtracted from the integer portion, thereby enabling an offset-free, correct output to be obtained with respect to the input.

Thus, the communication apparatus according to the present embodiment performs oversampling to perform amplitude modulation, and is capable of supporting modulation schemes in which data points are included even when the input amplitude is small.

In the present embodiment, the order of the MASH circuit has been set to "3", but the MASH circuit may have an order of "N" (where N is an integer no less than "4"). The MASH circuit with an order of "N" generates an offset of "N−1".

Figure 5:
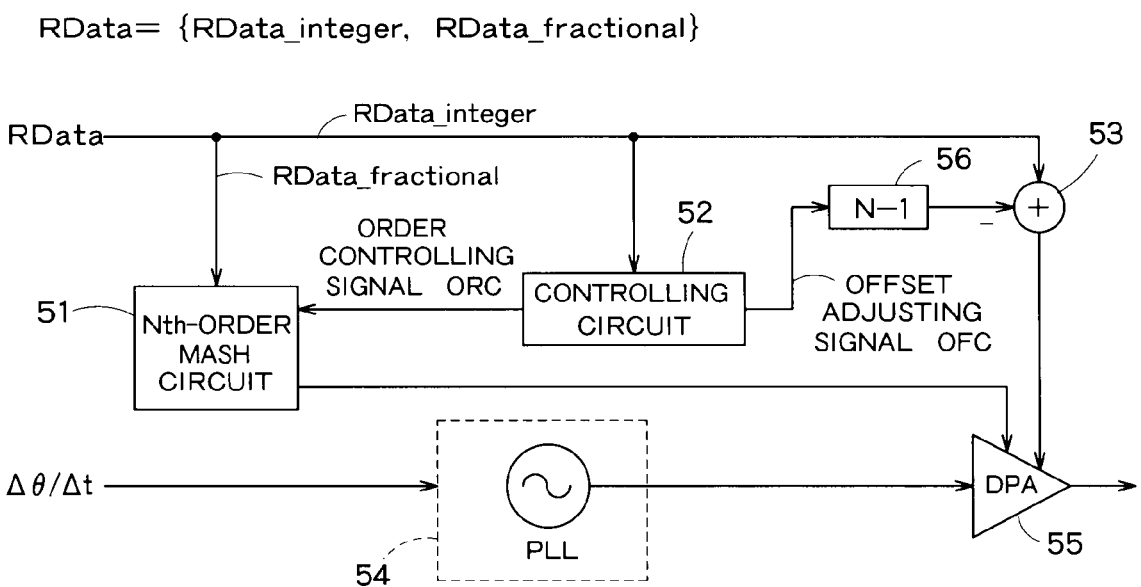
FIG. 5 is a schematic diagram of the communication apparatus according to a modification.

A schematic configuration of a communication apparatus including an Nth-order MASH circuit is shown in FIG. 5. A subtractor 53 subtracts the output value of an offset adjusting unit 56 from the integer portion (RData_integer) of the amplitude controlling signal (RData), and outputs the result to a DPA 55.

The DPA 55 sets a source voltage value based on the output of the subtractor 53 and the output of a MASH circuit 51, multiplies the resulting source voltage with the phase modulated signal outputted from a local oscillator 54, and outputs the result.

A controlling circuit 52 outputs an order controlling signal ORC and an offset adjusting signal OFC based on a size of the integer portion (RData_integer) of the amplitude controlling signal (RData). The offset adjusting unit 56 outputs a value from "0" to "N−1" based on the offset adjusting signal OFC, to the subtractor 53.

For instance, when the integer portion is greater than "N−1", the controlling circuit 52 outputs an offset adjusting signal OFC so that "N−1" is outputted from the offset adjusting unit 56. When the integer portion is greater than "N−k" (where "k" is an integer satisfying $2 \leq k \leq N-1$), and no more than "N−k+1", the controlling circuit 52 outputs an offset adjusting signal OFC so that "N−k" is outputted from the offset adjusting unit 56. Further, when the integer portion is "1" or less, the controlling circuit 52 outputs an offset adjusting signal OFC so that "0" is outputted from the offset adjusting unit 56.

Moreover, when the integer portion is greater than "N−1", the controlling circuit 52 outputs an order controlling signal ORC which sets the order of the MASH circuit 51 to "N". When the size of the integer portion is greater than "N−k" (where k is an integer that satisfies $2 \leq k \leq N-1$) and no more than "N−k+1", the controlling circuit 52 outputs an order controlling signal ORC which switches the order of the MASH circuit 51 to "N−k+1". When the size of the integer portion is "1" or less, the controlling circuit 52 outputs an order controlling signal ORC which switches the order of the MASH circuit 51 to "1".

By subtracting an offset amount (the output value from the offset adjusting unit 56) from the integer portion (RData_integer) of the amplitude controlling signal (RData) and controlling the order of the MASH circuit 51 in this way, it is possible to obtain from the DPA 55 a correct output in which the offset of the MASH circuit 51 does not appear.

The MASH circuit may be implemented using a variety of schemes which differ from those of the above-described embodiments. However, whichever method is used, it is possible to obtain a correct output even when the input amplitude is small by adjusting the MASH order and the offset amount to be subtracted from the integer portion, in the same way as in the above-described embodiments.

The communication apparatus according to the above-described embodiments can make use of a wireless LAN device or the like.

What is claimed is:

1. A communication apparatus comprising:
   a local oscillator which performs phase modulation based on a phase component of a baseband signal and outputs a phase modulated signal;
   a controlling circuit which is supplied with an integer portion included in an amplitude component of the baseband signal and generates and outputs a controlling signal based on a size of the integer portion;
   a subtractor which is supplied with the integer portion and the controlling signal, subtracts a value of the controlling signal from the integer portion, and outputs a result;
   a MASH (Multi-stAge-noise-Shaping) circuit which is a second-order delta-sigma modulation means supplied with a fractional portion of the amplitude component, an order of the MASH circuit being switchable between a first order and a second order based on the controlling signal; and
   an amplifier which sets a voltage value based on an output of the MASH circuit and an output of the subtractor, multiplies the voltage value and the phase modulated signal, and outputs a result.

2. The communication apparatus according to claim 1, wherein
   the controlling circuit generates and outputs the controlling signal with a value of 1 when the integer portion is greater than 1, and with a value of 0 when the integer portion is 1 or less, and the MASH circuit fixes a second-order side output to 0 to switch the order to first order when the controlling signal is 0.

3. The communication apparatus according to claim 1, wherein the MASH circuit includes:
   a first adder which adds an output value of a directly preceding clock-pulse and the fractional portion and outputs a first result;
   a second adder which adds the output value from a directly preceding clock-pulse and the first result from the first adder and outputs a second result;
   a first AND gate which is supplied with the second result from the second adder and the controlling signal; and
   a second AND gate which is supplied with an inverted value of the second result from the second adder and the controlling signal.

4. The communication apparatus according to claim 3, wherein
   the controlling circuit generates and outputs the controlling signal with a value of 1 when the integer portion is greater than 1, and with a value of 0 when the integer portion is 1 or less.

5. The communication apparatus according to claim 3, wherein
   the first adder and the second adder are supplied with a clock signal of higher frequency than a clock signal used to generate the amplitude component.

6. A communication apparatus comprising:
   a local oscillator which performs phase modulation based on a phase component of a baseband signal and outputs a phase modulated signal;
   a controlling circuit which is supplied with an integer portion included in an amplitude component of the baseband signal, and generates and outputs an order controlling signal and an offset adjusting signal based on a size of the integer portion;
   a multiplexer which selects and outputs an output value of 0, 1 or 2 based on the offset adjusting signal;
   a subtractor which is supplied with the integer portion and the output value of the multiplexer, subtracts the output value of the multiplexer from the integer portion, and outputs a subtraction result;
   a MASH circuit which is a third-order delta-sigma modulation means supplied with a fractional portion of the amplitude component, an order of the MASH circuit being switchable among a first order, a second order and a third order based on the order controlling signal; and
   an amplifier which sets a voltage value based on an output of the MASH circuit and an output of the subtractor, multiplies the voltage value with the phase modulated signal, and outputs a result.

7. The communication apparatus according to claim 6, wherein
   the controlling circuit generates and outputs the offset adjusting signal so that 2 is selected and outputted by the multiplexer when the integer portion is greater than 2, 1 is selected and outputted by the multiplexer when the integer portion is greater than 1 and no more than 2, and 0 is selected and outputted by the multiplexer when the integer portion is 1 or less.

8. The communication apparatus according to claim 6, wherein
   the controlling circuit generates and outputs the order controlling signal so that the MASH circuit has an order of 3 when the integer portion is greater than 2, an order of 2 when the integer portion is greater than 1 and no more than 2, and an order of 1 when the integer portion is 1 or less.

9. The communication apparatus according to claim 6, wherein the MASH circuit includes:
   a first adder which adds an output value of a directly preceding clock-pulse and the fractional portion and outputs a first result;
   a second adder which adds the output value from the directly preceding clock-pulse and the first result from the first adder and outputs a second result;
   a third adder which adds the output value from the directly preceding clock pulse and the second result from the second adder and outputs a third result;
   a first AND gate which is supplied with the second result from the second adder and the controlling signal; and
   a second AND gate which is supplied with an inverted value of the second result from the second adder and the controlling signal;
   a third AND gate which is supplied with the third result from the third adder and the controlling signal; and
   a fourth AND gate which is supplied with an inverted value of the third result from the third adder and the controlling signal.

10. The communication apparatus according to claim 9, wherein
    the controlling circuit generates the order controlling signal to have two-bits which take values of 11 when the integer portion is greater than 2, values of 01 when the integer portion is greater than 1 and no more than 2, and values of 00 when the integer portion is 1 or less, outputs the lower-order bit of the two-bit order controlling signal to the first AND gate and the second AND gate, and outputs the upper-order bit of the two-bit order controlling signal to the third AND gate and the fourth AND gate.

11. The communication apparatus according to claim 6, wherein the first adder, the second adder and the third adder are supplied with a clock signal which is of a higher frequency than the clock signal used to generate the amplitude component.

12. A communication apparatus comprising:

a local oscillator which performs phase modulation based on a phase component of a baseband signal and outputs a phase modulated signal;

a controlling circuit which is supplied with an integer portion included in an amplitude component of the baseband signal, and generates and outputs an order controlling signal and an offset adjusting signal based on a size of the integer portion;

an offset adjusting unit which outputs a value from 0 to N−1 (where N is an integer no less than 4) based on the offset adjusting signal;

a subtractor which is supplied with the integer portion and the value outputted by the offset adjusting unit, subtracts the value outputted by the offset adjusting unit from the integer portion, and outputs a result;

a MASH circuit which is a delta-sigma modulation means of order N supplied with a fractional portion of the amplitude component, an order being switchable to any order from N to 1 based on the order controlling signal; and an amplifier which sets a voltage value based on an output of the MASH circuit and an output of the subtractor, multiplies the voltage value and the phase modulated signal, and outputs a result.

13. The communication apparatus according to claim 12, wherein the controlling circuit outputs, when a size of the integer portion is greater than N−1, the order controlling signal to give the MASH circuit an order of N and the offset adjusting signal so that the output value of the offset adjusting unit is N−1, outputs, when a size of the integer portion is greater than N−k (where k is an integer which satisfies $2 \leq k \leq N-1$) and no more than N−k+1, the order controlling signal to give the MASH circuit an order of N−k+1 and the offset adjusting signal so that the output value of the offset adjusting unit is N−k, and outputs, when a size of the integer portion is 1 or less, the order controlling signal to give the MASH circuit an order of 1 and the offset adjusting signal so that the output value of the offset adjusting unit is 0.

* * * * *